(12) United States Patent
Yoshida et al.

(10) Patent No.: US 8,759,837 B2
(45) Date of Patent: Jun. 24, 2014

(54) NITRIDE SEMICONDUCTOR SUBSTRATE

(75) Inventors: Harumasa Yoshida, Hamamatsu (JP); Yasufumi Takagi, Hamamatsu (JP); Masakazu Kuwabara, Shizuoka (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/425,887

(22) Filed: Mar. 21, 2012

(65) Prior Publication Data

US 2012/0175633 A1 Jul. 12, 2012

Related U.S. Application Data

(63) Continuation of application No. 12/530,067, filed on Sep. 4, 2009, now Pat. No. 8,237,194, which is a continuation-in-part of application No. PCT/JP2008/054864, filed on Mar. 17, 2008.

(30) Foreign Application Priority Data

Mar. 22, 2007 (JP) ................................ P2007-075421

(51) Int. Cl.
*H01L 29/20* (2006.01)
(52) U.S. Cl.
USPC ..................................... 257/76; 257/E29.089
(58) Field of Classification Search
USPC ............................................ 257/76, E29.089
See application file for complete search history.

(56) References Cited

U.S. PATENT DOCUMENTS

| | | |
|---|---|---|
| 6,320,209 B1 | 11/2001 | Hata et al. |
| 6,468,347 B1 | 10/2002 | Motoki et al. |
| 6,478,871 B1 | 11/2002 | Shealy et al. |
| 6,791,117 B2 | 9/2004 | Yoshitake et al. |
| 6,967,359 B2 | 11/2005 | Kamiyama et al. |
| 7,095,062 B2 | 8/2006 | Linthicum et al. |
| 7,288,830 B2 | 10/2007 | Shibata |
| 7,481,881 B2 | 1/2009 | Okahisa |

(Continued)

FOREIGN PATENT DOCUMENTS

| | | |
|---|---|---|
| JP | 2001-267692 | 9/2001 |
| JP | 2002-335051 | 11/2002 |
| JP | 2002-353134 | 12/2002 |
| JP | 2005-235911 | 9/2005 |

OTHER PUBLICATIONS

H. Zhou et al., "Al incorporation in AlGaN on (1 1 2 2) and (0 0 0 1) surface orientation," Journal of Crystal Growth, Jun. 15, 2006, vol. 292, Issue 1, pp. 5-9.

(Continued)

*Primary Examiner* — Colleen Matthews
*Assistant Examiner* — William Harriston
(74) *Attorney, Agent, or Firm* — Drinker Biddle & Reath LLP

(57) ABSTRACT

A nitride semiconductor substrate is featured in comprising: a GaN semiconductor layer grown on a base layer, which has a substantially triangular cross-section along the thickness direction thereof, a periodic stripe shapes, and uneven surfaces arranged on the stripes inclined surfaces; and an overgrown layer composed of AlGaN or InAlGaN on the GaN semiconductor layer.

2 Claims, 25 Drawing Sheets

(56) References Cited

U.S. PATENT DOCUMENTS

| | | |
|---|---|---|
| 7,727,331 B2 | 6/2010 | Morita et al. |
| 7,772,585 B2 | 8/2010 | Uematsu et al. |
| 2002/0127856 A1 | 9/2002 | Kunisato et al. |
| 2002/0167028 A1 | 11/2002 | Kunisato et al. |
| 2005/0037526 A1* | 2/2005 | Kamiyama et al. ............. 438/22 |
| 2006/0054942 A1 | 3/2006 | Nakahata |
| 2007/0018187 A1* | 1/2007 | Lee et al. ........................ 257/98 |
| 2007/0066020 A1 | 3/2007 | Beach |
| 2007/0139141 A1 | 6/2007 | Knollenberg et al. |

OTHER PUBLICATIONS

V. Wagner et al., "Influence of the carrier gas composition on morphology, dislocations, and microscopic luminescence properties of selectively grown GaN by hydride vapor phase epitaxy," Journal of Applied Physics, 2002, Aug. 1, 2002, vol, 92, No. 3, pp. 1307-4316.

K. Hiramatsu et al., "Recent Progress in Selective Area Growth and Epitaxial Lateral Overgrowth of III-Nitrides: Effects of Reactor Pressure in MOVPE Growth," Selective Area Growth of III-Nitrides, Phys. Stat. Sol. (a) 176, 535 (1999), Jul. 4, 1999, pp. 535-543.

\* cited by examiner

Fig.10
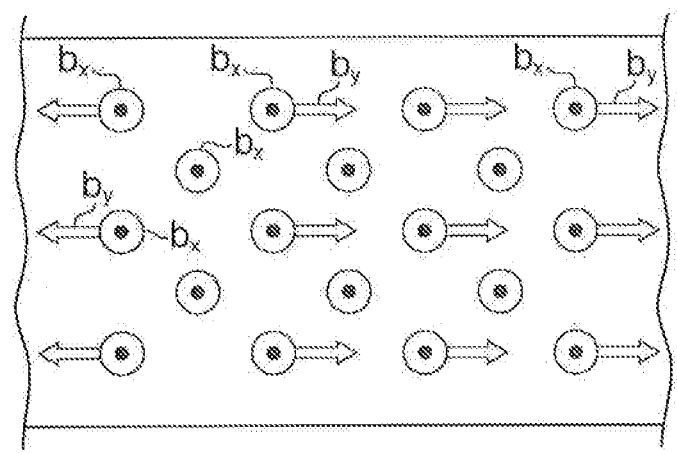
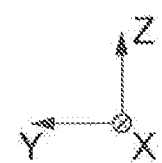

Fig.13
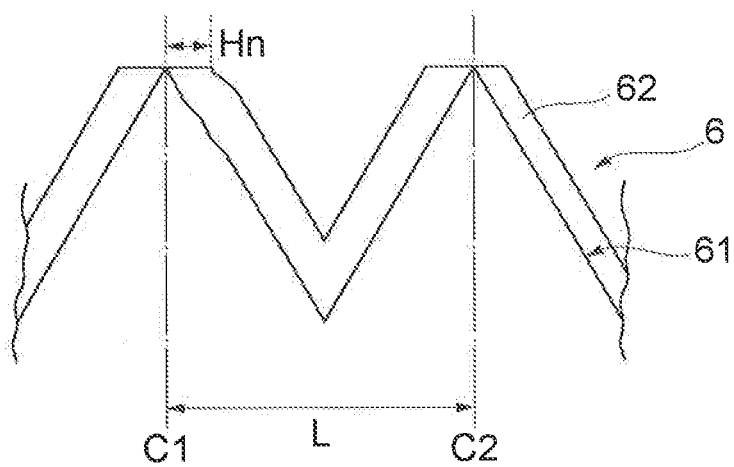
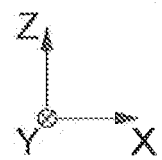

Fig. 20

| SUBSTRATE 2 | BUFFER LAYER 3 | MASK 5 | FIRST GaN SEMICONDUCTOR LAYER 4 | SECOND GaN SEMICONDUCTOR LAYER 6 | OVERGROWN LAYER 7 |
|---|---|---|---|---|---|
| SAPPHIRE | LOW TEMPERATURE GaN BUFFER LAYER | SiO$_2$ | GaN | GaN | AlGaN |
| SiC | LOW TEMPERATURE AlN BUFFER LAYER | SiN | AlN | AlN | InAlGaN |
| Si | LOW TEMPERATURE InGaN BUFFER LAYER | SPACING | InGaN | InGaN | |
| GaN | LOW TEMPERATURE AlGaN BUFFER LAYER | | AlGaN | AlGaN | |
| AlN | LOW TEMPERATURE InAlGaN BUFFER LAYER | | InAlGaN | InAlGaN | |
| Ga$_2$O$_3$ | NOT INSERTED | | NOT INSERTED | | |
| ZnO | GaN | | | | |
| | AlN | | | | |
| | InGaN | | | | |
| | AlGaN | | | | |
| | InAlGaN | | | | |

NITRIDE SEMICONDUCTOR SUBSTRATE

CROSS REFERENCE TO RELATED APPLICATIONS

This is a continuation application of copending application Ser. No. 12/530,067, filed on Sep. 4, 2009, which is a continuation in part of International Application No. PCT/JP2008/054864, filed on Mar. 17, 2008, which claims the benefit of Japanese Patent Application No. 2007-075421, filed in Japan on Mar. 22, 2007, the contents of each of which are incorporated by this reference.

BACKGROUND OF THE INVENTION

1. Field of the Invention

The present invention relates to a nitride semiconductor substrate.

2. Related Background Art

In recent years, light emitting diodes (LEDs) and semiconductor lasers (LDs) that use a nitride semiconductor (GaN, AlGaN, InAlGaN) have frequently been used. Meanwhile, in a cladding layer, it is necessary to use AlGaN, etc., which has a higher AlN molar fraction to secure a large difference in band gap in relation to an active layer, in order to attempt to shorten the light-emitting wavelength. Furthermore, in the case of LDs, a cladding layer having a large thickness, the AlN molar fraction of which is still higher, will be required in order to carry out confinement of light.

However, in a nitride semiconductor substrate to form such a device, AlGaN having a high AlN molar fraction has small lattice spacing, and a difference in the lattice spacing between the AlGaN and GaN having relatively large lattice spacing will increase still further. Therefore, if an AlGaN layer is grown directly on a flat GaN layer, a tensile stress is produced in the AlGaN layer due to lattice mismatching between the AlGaN layer and the GaN layer, wherein when the film thickness exceeds a certain critical film thickness, cracks can be generated. Since the GaN layer as a base layer has a number of lattice defects, a number of crystal defects (dislocation) can be also generated in the AlGaN layer grown on the GaN layer.

In order to solve the above-described problems, a technique described in Patent Document 1 (Patent Document 1: Japanese Published Unexamined Patent Application No. 2005-235911) as shown in FIG. 23 and FIG. 24 has been developed. FIG. 23 is a plan view of a nitride semiconductor substrate 1', and FIG. 24 is a sectional view taken along the arrow XXIV-XXIV of the nitride semiconductor substrate 1' shown in FIG. 23. The nitride semiconductor substrate 1' is composed of a substrate 2', an AlN buffer layer 3', a first GaN layer 4', a second GaN layer 6', and an AlGaN overgrown layer (embedded layer) 7'. The second GaN layer 6' is selectively grown (Epitaxially Lateral Overgrowth) after striped $SiO_2$ masks 5' were formed on the first GaN layer 4', wherein the second GaN layer 6' having cross-sectionally triangular shapes with minor planes (facets) can be formed. And, since the crystal defects (dislocations) are along the epitaxially growth direction, the dislocations on the second GaN layer 6' are turned along the lateral direction when the GaN is grown to the lateral direction on the mask 5' from a portion where the mask 5' does not exist. On the upper surface of the AlGaN layer 7' overgrown on the second GaN layer 6', while dislocations a' remains at portions corresponding to the top and valley of ridges of the second GaN layer 6', other portions are brought into a low defect (low dislocation) region R, wherein it is possible to prevent the generation of cracks.

SUMMARY OF THE INVENTION

However, in the case of the technique according to Patent Document 1, it was insufficient to prevent the generation of cracks. It was also taken into consideration that an intermediate layer such as an AlN grown at a low temperature on the upper surface of the second GaN layer 6' is formed. However, it was insufficient to prevent the generation of cracks. The present inventor, et al., found from the results of their concentrated studies that, with these techniques, since the stripe inclined surface 61' of the second GaN layer 6' (striped pattern) having cross-sectionally triangular shapes goes the direction (the Y direction) along the stripes as shown in FIG. 25. The lateral direction growth vector of crystal of overgrown AlGaN layer 7' with a high AlN molar fraction is brought into only a direction (the X direction) orthogonal to the direction along the stripes. Since the tensile stress in the Y direction is not relaxed, although a compression stress in the X direction relaxes the tensile stress generated in the AlGaN layer 7' generated by the difference in lattice constant between the second GaN layer 6' and the AlGaN layer 7', cracks are generated along the X direction.

Based on the above-described finding, the present inventors have also found, as the result of further investigations, that generation of cracks in any direction can be prevented by forming uneven surfaces on stripe-patterned inclined surfaces of the triangular shapes, and making the lateral direction growth vectors of the overgrowth layer to have a growth component in the direction (Y direction) along the stripes, and the inventor has achieved the present invention that can solve these issues. Thus, the object of the present invention is to provide a nitride semiconductor substrate capable of preventing the generation of cracks and of reducing the dislocation density.

A nitride semiconductor substrate according to the present invention is provided with a GaN semiconductor layer and an overgrown layer (embedded layer) composed of AlGaN or InAlGaN formed on the GaN semiconductor layer, wherein the GaN semiconductor layer has a plurality of protruding stripes and both sides of the stripes have uneven surfaces, respectively.

In other words, the nitride semiconductor substrate includes a GaN semiconductor lager, which is grown on a base layer and has a substantially triangular cross-section along the thickness direction, a periodic striped shape, and uneven surfaces arranged on the striped inclined surfaces, and an overgrown layer which is formed on the GaN semiconductor layer and is composed of AlGaN or InAlGaN. Being substantially triangular means a shape having three corner portions, wherein the corner portions may be curved, and may be made into a trapezoid by cutting off one of the corner portions. In addition, if such a shape includes a substantial triangle and has two sides including the tip end of growth as the corner portion, the shape may be acceptable even if the profile of the remaining one side cannot be seen by linking a plurality of adjacent triangles with each other in the lateral direction. That is, it is sufficient that the surface of the GaN semiconductor exhibits generally triangular waves.

According to the present invention, the GaN semiconductor layer formed on the upper surface of the base layer is a substantially triangular cross-section along the thickness direction and has periodic stripes and uneven surfaces on the striped inclined surfaces. With the uneven surfaces, the striped inclined surfaces are provided with surfaces other than those in the direction along the stripes. Therefore, the lateral direction growth vectors of an overgrown AlGaN or InAlGaN layer on the GaN semiconductor layer not only have components orthogonal to the direction along the stripes but also components in the direction along the stripes. Accordingly, the stresses that can cause the generation of cracks in the overgrown layer are relaxed in all the directions, and it is possible to prevent the generation of cracks. Since the cross-section of the GaN semiconductor layer along the thickness direction is substantially triangular, dislocations are reduced on the upper surface of the overgrown layer due to the lateral direction growth in the GaN semiconductor layer and the overgrown layer.

In the present invention, where the uneven surfaces on the striped inclined surfaces of the GaN semiconductor layer are inclined surfaces roughly along the inclination of the striped inclined surfaces and are composed of a number of small inclined surfaces in which the perpendicular directions of the inclined surfaces in the horizontal section are multidirectional, the lateral direction growth vectors of the overgrowth layer composed of AlGaN or InAlGaN are provided in almost all the directions in the horizontal plane. Therefore, the stresses in the overgrown layer can be further uniformly relaxed, wherein it is possible to sufficiently prevent the generation of cracks.

Further, in the present invention, when it is assumed that the pitch of stripes is L, the average value Have and the standard deviation Hsd of uneven size of the uneven surfaces in the pitch direction of a substantially triangular top at the corresponding top of the GaN semiconductor layer are 0.0048 L/4≤Hsd, Have ≤L/10, the stresses can be sufficiently relaxed even if the AlN molar fraction of the overgrown layer composed of AlGaN or InAlGaN is 20% or more, and influences of the flat portions of the top surfaces of triangular facets of the GaN semiconductor layer are reduced, wherein it is possible to further sufficiently prevent the generation of cracks in the overgrown layer and to further sufficiently reduce the dislocations.

According to the present invention, the nitride semiconductor substrate is capable of reducing the dislocation density at almost the entire surface thereof and preventing the generation of cracks, and semiconductor devices using the substrate are excellent in optical characteristics, and electric conductivity characteristics etc.

BRIEF DESCRIPTION OF THE DRAWINGS

FIG. 10 is a view describing a lateral direction growth vectors according to the embodiment.
FIG. 13 is a sectional view taken along the arrow XIII-XIII of the second GaN semiconductor layer.
FIG. 20 is a table showing materials of respective layers according to the embodiment.

DESCRIPTION OF THE PREFERRED EMBODIMENT

Figure 1:
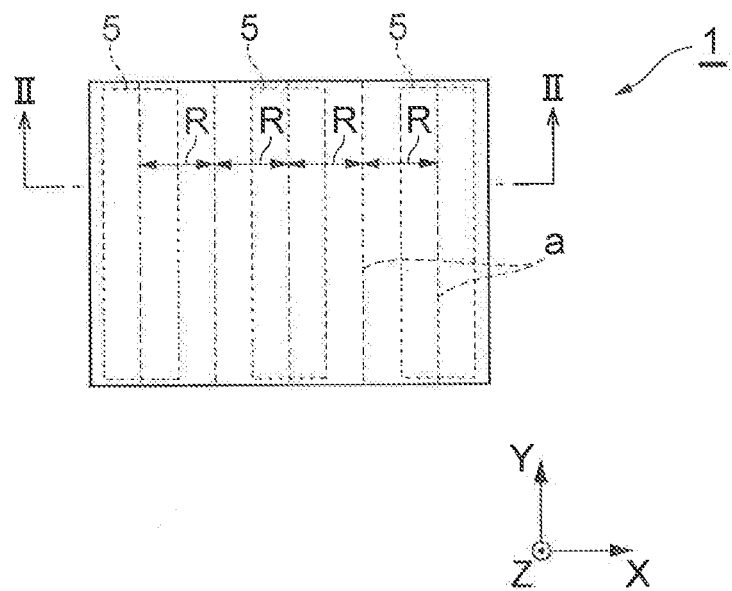
FIG. 1 is a plan view of a nitride semiconductor substrate.

Hereinafter, a description is given of a nitride semiconductor substrate according to the embodiment with reference to the accompanying drawings. In the description, the same elements are given the same reference numerals, and overlapping description is omitted.

Figure 2:
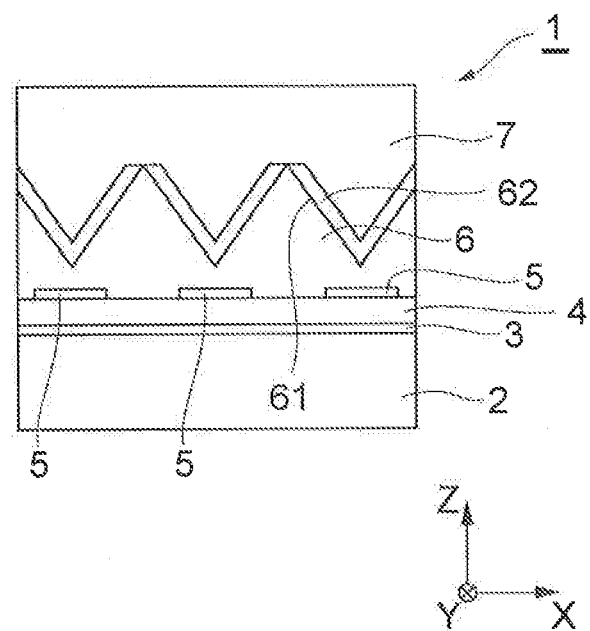
FIG. 2 is a longitudinally-sectional view of the nitride semiconductor substrate shown in FIG. 1.

FIG. 1 is a plan view of a nitride semiconductor substrate 1 according to the embodiment, and FIG. 2 is a sectional view taken along the arrow II-II of the nitride semiconductor substrate shown in FIG. 1.

A 25-nm-thick low-temperature GaN is grown as a buffer layer 3 on the upper surface of a substrate 2 composed of sapphire, and the first GaN semiconductor layer 4 as a base layer is grown thereon. The film thickness of the first GaN layer 4 is 2.5 µm being thicker than the buffer layer 3. Plurality of striped masks 5 are provided on the upper surface of the first GaN layer 4. The mask 5 is composed of a SiO$_2$ film, the film thickness of which is 300 nm, the width of which is 3 µm, and the masks extend in the perpendicular direction of paper. In addition, the pitch of stripes of the mask 5 is determined to be 6 µm.

The second GaN layer 6 is grown on the first GaN layer 4 provided with the striped masks 5. The second GaN layer 6 is the second GaN semiconductor layer (striped pattern) with substantially triangular minor planes (facets). The second GaN layer 6 is grown from the upper surface of the first GaN layer 4 as a base. Herein, since the striped masks 5 are provided on the surface of the first GaN layer 4, GaN begins to grow from the unmasked areas of the first GaN layer 4 between the masks 5 and grows in the lateral direction (the horizontal direction) above the masks 5, and is coalesced at the middle part in the width direction (the X-axis direction) of the masks 5.

In addition, since the growing rate of the second GaN layer 6 in the thickness direction (positive direction of the Z-axis in FIG. 2) is higher at the middle part between the masks 5, the second GaN in the X-Z section (the section perpendicular to the lengthwise direction (Y-axis) of the stripes) along the thickness direction (Z-axis) exhibits substantially triangular facets. The pitch of the stripes is the same 6 μm as that of the mask 5.

Figure 23:
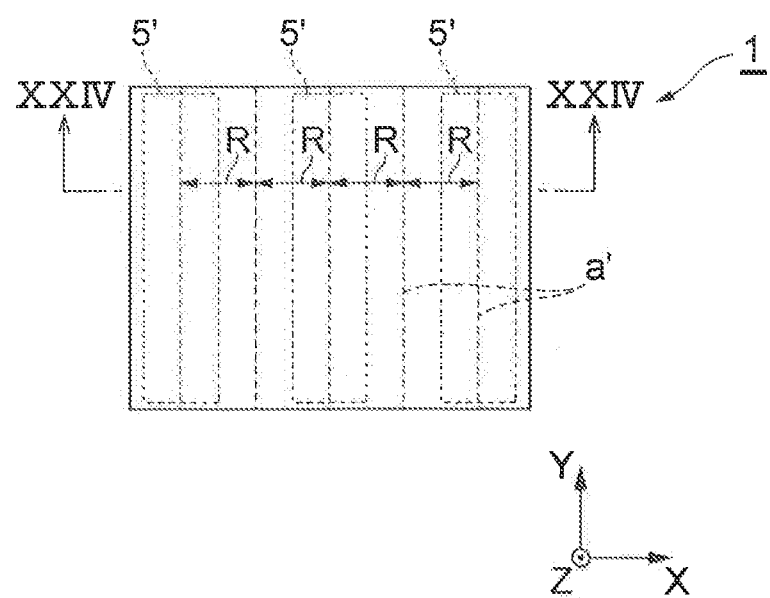
FIG. 23 is a plan view of a nitride semiconductor substrate according to a comparative example.
Figure 24:
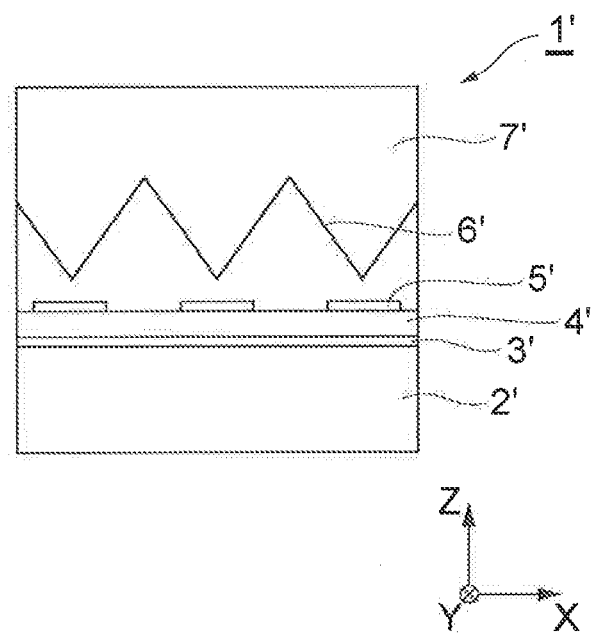
FIG. 24 is a longitudinally-sectional view of the nitride semiconductor substrate shown in FIG. 23.

An AlGaN layer 7 is overgrown directly on the upper layer of the second GaN layer 6. The AlGaN layer 7 is grown in the lateral direction from the inclined surfaces as the base points since the second GaN layer 6 has the inclined surfaces, and the upper surface thereof becomes flat with an increase in the thickness, and the triangular facet of the second GaN layer 6 will be embedded. The film thickness of the AlGaN layer 7 is approximately 8.4 μm (this is an equivalent value as a flat layer), and as shown in FIG. 1, although some dislocations "a" of crystal defects on the upper surface remains at portions corresponding to the top and valley of a ridge of the second GaN layer 6 as in the cases of FIG. 23 and FIG. 24 described with respect to the comparative example, the other portions become low defect (low dislocation) areas. The thickness values of the respective layers in the present embodiment are not limited to the above-described values.

Figure 25:
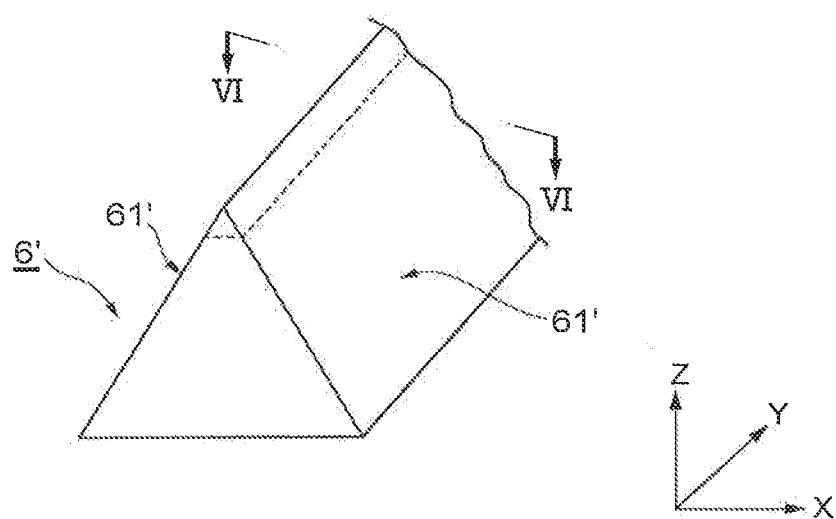
FIG. 25 is a perspective view of the second GaN semiconductor layer according to the comparative example.

Here, since uneven surfaces 62 are formed on the inclined sides (inclined surfaces) 61 of the triangular facets of the second GaN layer 6, the second GaN layer 6 greatly differs from the comparative example shown in FIG. 25.

Figure 3:
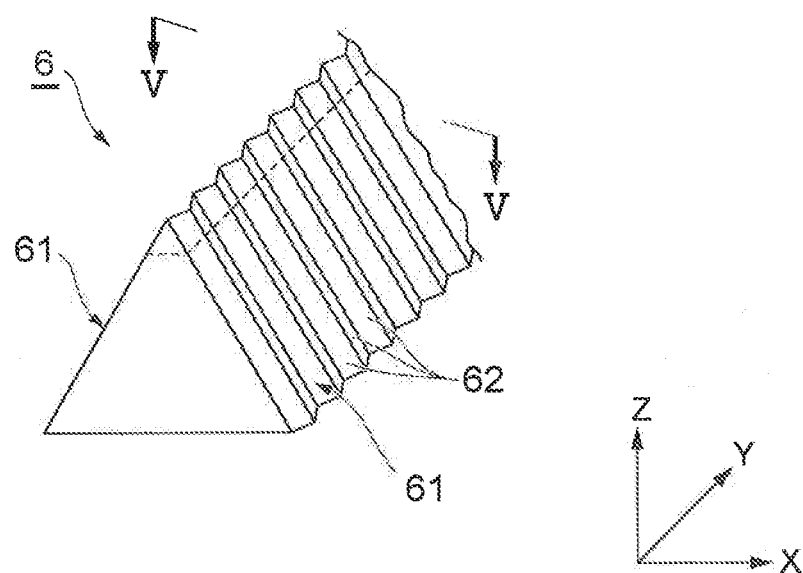
FIG. 3 is a perspective view of the second GaN semiconductor layer.

FIG. 3 is a perspective view of the second GaN layer 6.

As shown in FIG. 3, the uneven surfaces 62 composed of a number of recesses and projections having triangular wave shape in cross-section are formed on the inclined surface 61 of one triangular pole pattern that composes the stripe pattern. The uneven surfaces 62 are composed of a number of small inclined surfaces substantially along the inclination of the inclined surfaces of the stripes. In the drawing, although only the right side inclined surface is shown, the uneven surface 62 is also formed at the left side inclined surface. As shown in FIG. 3, some of the triangular pole patterns have a sharp top and have almost no flat surface thereat as shown in FIG. 3, and other ones have a flat surface 63 formed at the top thereof as shown in FIG. 4.

Figure 4:
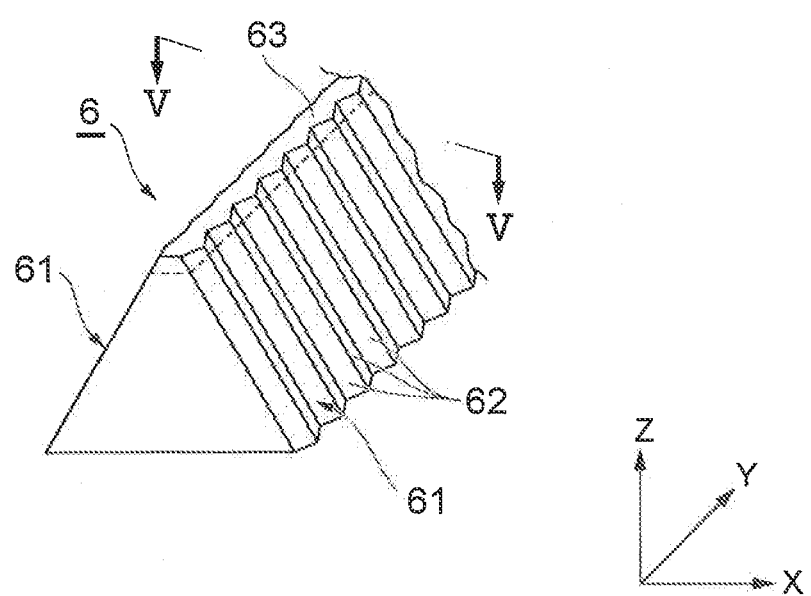
FIG. 4 is a perspective view of the second GaN semiconductor layer.
Figure 5:
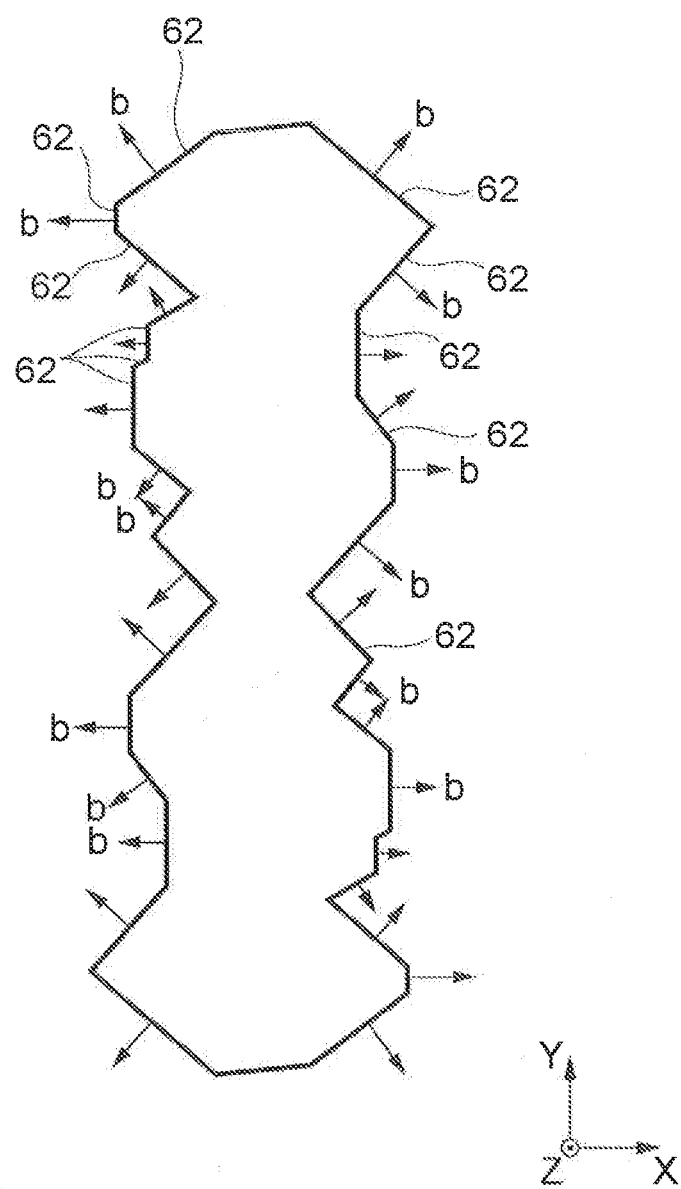
FIG. 5 is a horizontally sectional view showing the vicinity of the topside of the second GaN semiconductor layer according to an embodiment.
Figure 6:
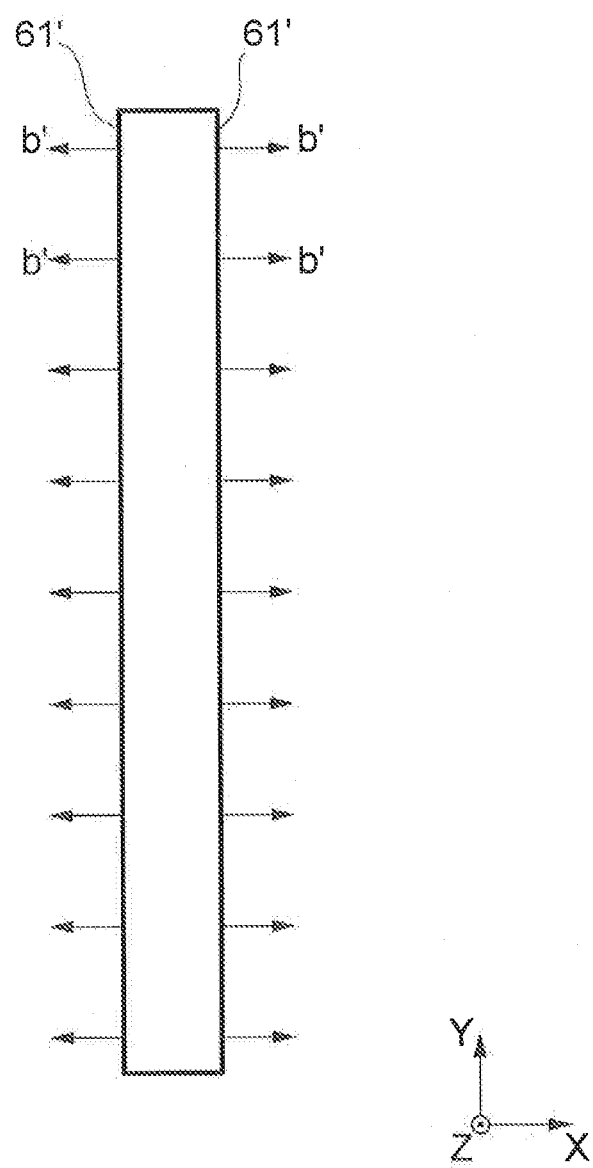
FIG. 6 is a horizontally sectional view showing the vicinity of the topside of the second GaN semiconductor layer according to a comparative example.

FIG. 5 shows a horizontally sectional view taken along the line V-V in the vicinity of the top along the dotted line in FIG. 3 (also in FIG. 4), and FIG. 6 shows a horizontally sectional view taken along the line VI-VI in the vicinity of the top along the dotted line in FIG. 25 of the comparative example.

In the comparative example of FIG. 6, since the inclined surface 61' is a flat surface along the direction (Y-axis direction) along the stripes, the straight line perpendicular to the inclined surface on the horizontal section is made into the direction (X-axis direction) orthogonal to the direction along the stripes. Therefore, all the growth vectors b' in the lateral direction (the horizontal direction) of the AlGaN layer 7' formed by the lateral direction growth on the second GaN layer 6' are along the X-axis direction. Accordingly, a compression stress in the X-axis direction in the AlGaN layer 7' relaxes the tensile stress generated by the difference in the lattice constant between the second GaN layer 6' and the AlGaN layer 7' with a high AlN molar fraction. However, since the tensile stress is not relaxed in the Y-axis direction, cracks will be generated along the X-axis direction.

On the other hand, in the present embodiment shown in FIG. 5, a number of small inclined surfaces 62 are provided along the inclined surfaces 61 of the stripes shown in FIG. 3 and FIG. 4, and the normal lines perpendicular to the small inclined surfaces 62 in the horizontal section (XY section) are oriented towards multiple directions so as to cover almost all the directions. Therefore, the lateral direction growth vectors b of the AlGaN layer 7, which are formed by the lateral direction growth on the second GaN layer 6, are oriented towards multiple directions. Accordingly, compressive stresses in almost all the directions in the AlGaN layer 7 relax the tensile stresses generated by a difference in the lattice constant between the second GaN layer 6 and the AlGaN layer 7 with a high AlN molar fraction, and it is possible to prevent the generation of cracks in all the directions.

Further detailed descriptions are given about the lateral direction growth vectors of the AlGaN layer 7 with reference to FIGS. 7-12.

Figure 7:
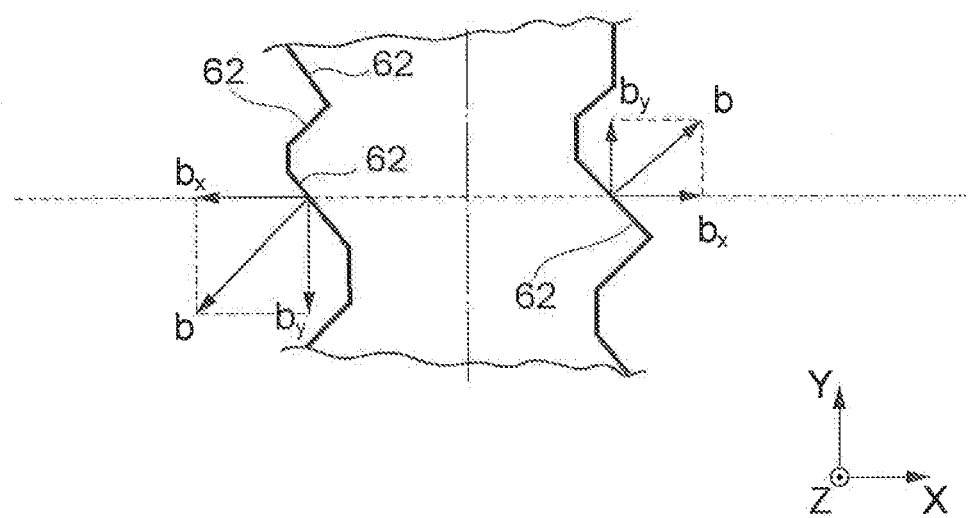
FIG. 7 is a horizontally sectional view showing the vicinity of the topside of a part of the second GaN semiconductor layer according to the embodiment.

FIG. 7 is a horizontally sectional view of the vicinity of the topside of a part of the second GaN semiconductor layer according to the present embodiment. As shown in FIG. 7, with respect to the lateral direction growth vector b on the horizontal plane, the vector b is composed of the X-direction component "bx" and the Y-direction component "by."

Figure 8:
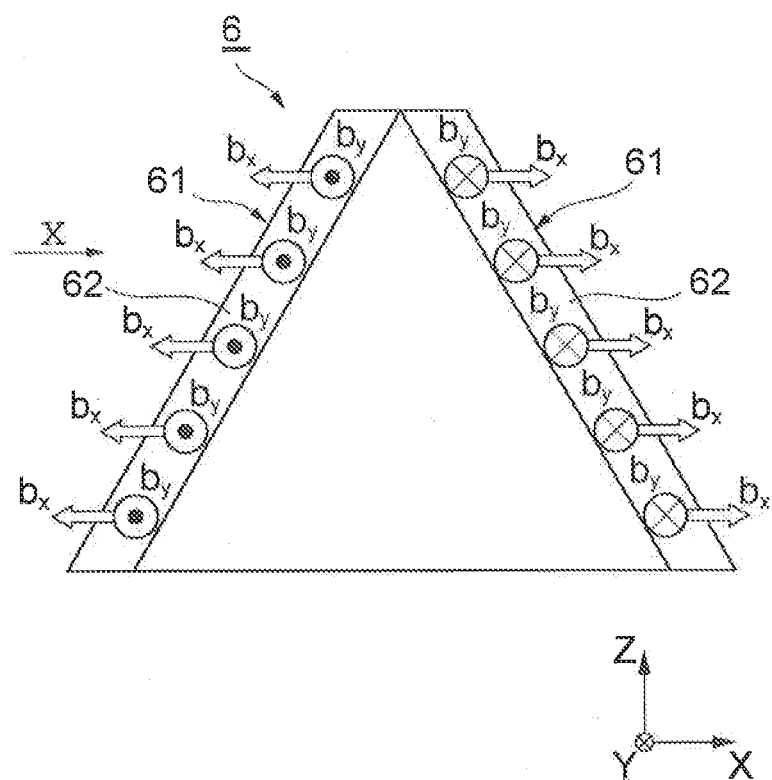
FIG. 8 is a view describing a lateral direction growth vectors according to the embodiment.

FIG. 8 is a view describing the lateral direction growth vector according to the present embodiment. In the present embodiment, as shown in FIG. 8, both the X-direction component "bx" and the Y-direction component "by" exist by the small inclined surfaces 62 of the second GaN layer 6.

Figure 9:
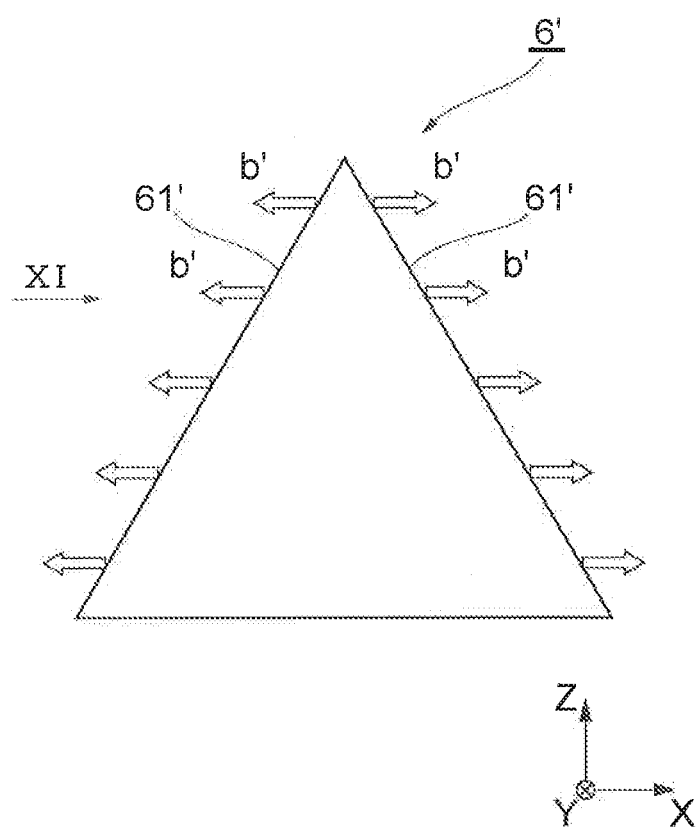
FIG. 9 is a view describing a lateral direction growth vectors according to the comparative example.

FIG. 9 is a sectional view in a plane (XY plane) orthogonal to the direction along which the stripes according to the comparative example extend. In contrast, as shown in FIG. 9, in the comparative example, the lateral direction growth vector b' has only the single component of the direction (X-direction) orthogonal to the direction along the stripes.

FIG. 10 is a side view of a stripe pattern when being observed in the X-direction in FIG. 8. In the present embodiment, as shown in FIG. 10, vector components "by" in both lateral directions of the paper exist. The present embodiment shown in FIG. 8 and FIG. 10 shows a case where an uneven structure on the inclined surface 61 of the triangular facet is almost the same from the top of the triangular facet to the bottom thereof. However, there may be cases where the shape of the uneven structure variously changes and the direction of the normal line of the inclined surface changes on one small inclined surface 62.

Figure 11:
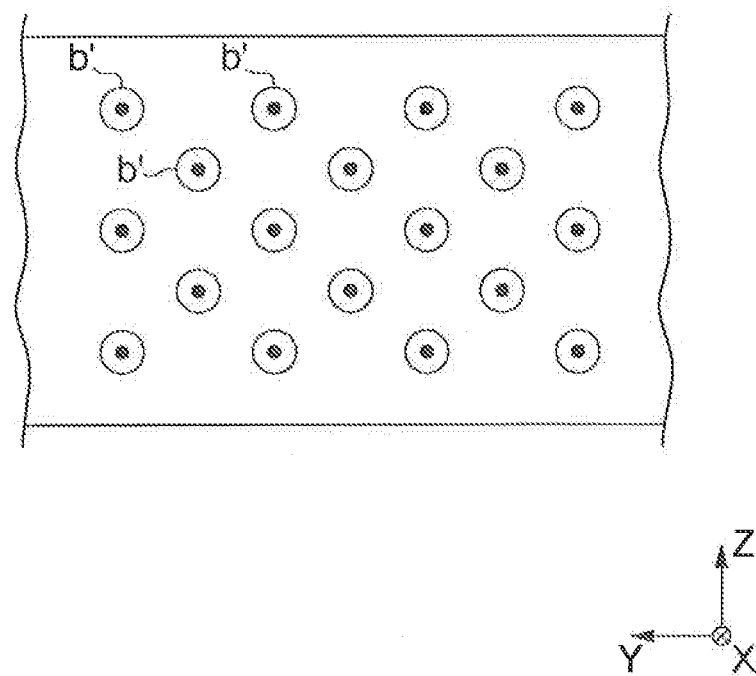
FIG. 11 is a view describing a lateral direction growth vectors according to the comparative example.

FIG. 11 is a side view of a stripe pattern when being observed in the XI direction in FIG. 9. In contrast, in the comparative example, as shown in FIG. 11, only the vector component to this direction (the negative X-axis direction) perpendicular to the paper in the lateral direction growth vector b' exists, wherein strains in the Y-direction cannot be sufficiently relaxed.

Figure 12:
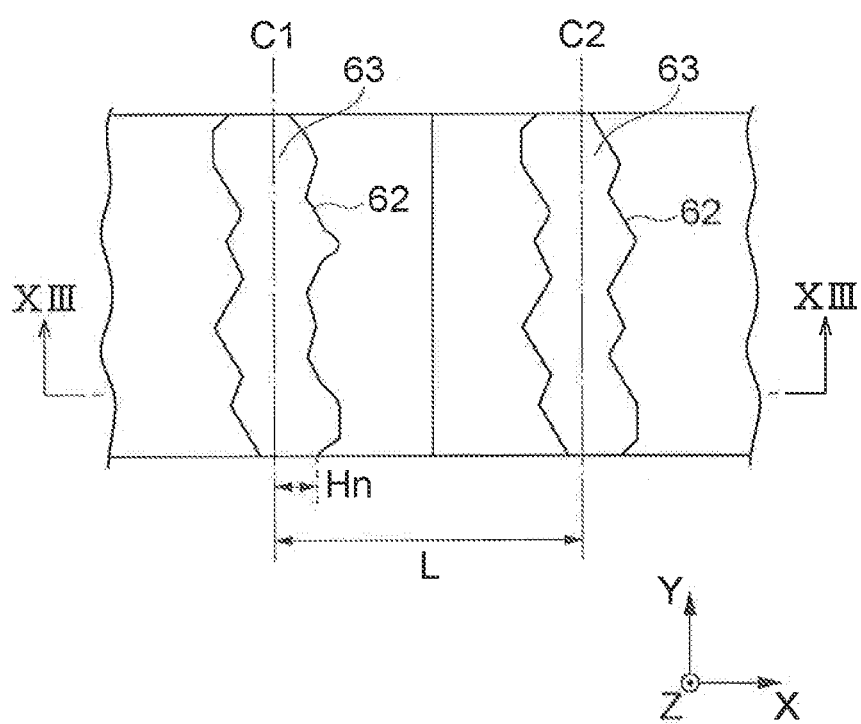
FIG. 12 is a plan view of the second GaN semiconductor layer.

Next, a description is given about the stripe pitch L and uneven sizes of the second GaN layer 6 with reference to FIG. 12 and FIG. 13.

FIG. 12 is a plan view of the second GaN layer 6 showing the uneven surface 62 at the top of the second GaN layer 6, and FIG. 13 is a cross-sectional view taken along the arrow XIII-XIII of the second GaN layer 6 shown in FIG. 12.

Since the uneven surfaces 62 are inclined, the uneven surfaces almost extend to the portion where the triangular facets are coalesced together at the bottom. However, FIG. 12 describes only the line of the uneven surfaces 62 at the upper surfaces at the top. The centerlines C1 and C2 are the centerlines of the top point (topside) located at the peaks in the positive direction of the Z-axis of the triangular facets.

In the present embodiment, the stripe pitch L of the striped triangular facet is determined to be 6 μm. However, the stripe pitch L is not limited thereto. It is preferable that the pitch L is in the range from 0.5 µm to 50 µm. If the pitch L is smaller than 0.5 µm, the size of the triangular facets is too small to prevent the generation of cracks and to reduce the defects by the lateral direction growth of an overgrowth layer. And, if the pitch L is larger than 50 µm, the size of the triangular facets becomes large and the film thickness also becomes large, wherein the time required for growth of crystal is excessively long. This is not practical in the production of substrates. In view of this point, it is further preferable that the pitch L is in the range from 2 µm to 10 µm.

Figure 14:
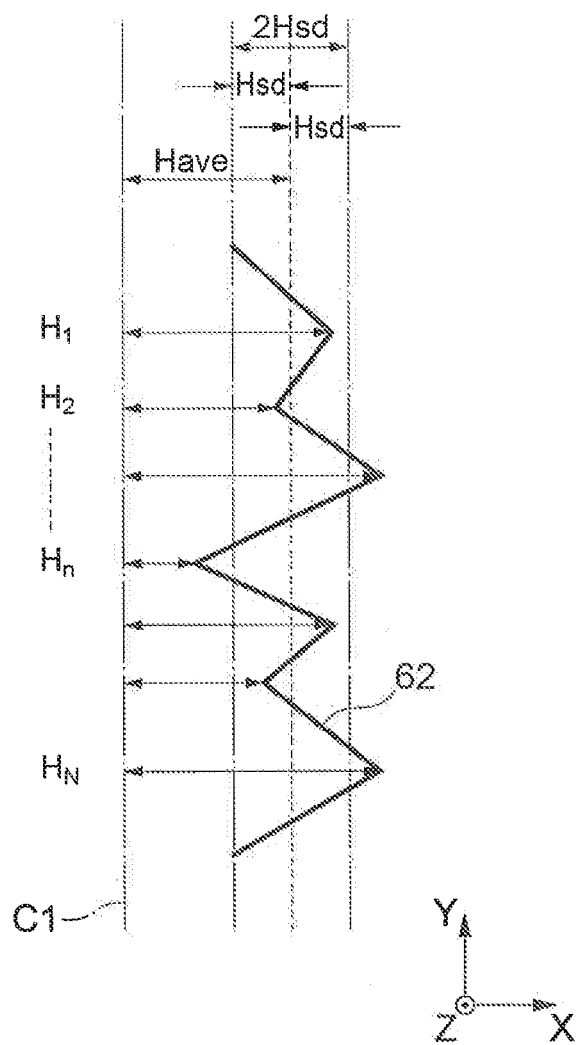
FIG. 14 is a schematic view showing the average size Have of unevenness of an uneven surface 62 according to the embodiment.

FIG. 14 shows uneven sizes in the direction of the stripe pitch L of the uneven surfaces (the horizontal direction and the direction (X-axis) orthogonal to the direction (Y-axis) along the stripes). And the drawing schematically shows the right side of the uneven surface 62 on the top upper surface in FIG. 12. As shown in the drawing, ridges and valleys of the uneven surfaces 62 exist slightly apart from the centerline C1 of the triangular facets. The drawing shows a case where the flat portions 63 clearly exist at the top as described in FIG. 4. In the case that almost no flat parts exist as in FIG. 3, most of the valleys of the uneven surfaces 62 are roughly coincident with the positions of the centerlines of the triangular facets in FIGS. 12-14.

In FIG. 14, if it is assumed that the lengths from the centerlines C1 to the respective ridges and valleys are $H_1$, $H_2$, ... $H_n$ ... $H_N$ (N is the total number of ridges and valleys, and N is a natural number), the average value Have and the standard deviation Hsd are expressed as the following equations.

Have=Average value of $Hn$=$(1/N) \cdot \Sigma Hn$

Hsd=Standard deviation of $Hn$= $\{(1/N) \cdot \Sigma (Hn - \text{Have})^2\}^{-2}$ And, the average value Have corresponds to the width from the stripe centerline C1 of a statistical flat surface (shown by dotted lines in FIG. 14) considered in a flattened state of the uneven surface. The standard deviation Hsd corresponds to a statistical width of a ridge or a valley of the unevenness from Have which expresses the position of the statistical flat surface, wherein the value obtained by doubling the standard deviation Hsd corresponds to the average width of the unevenness. With respect to the uneven size in the stripe pitch L direction, it is preferable that the upper limit is to be Have ≤L/10 and the lower limit is 0.0048 L/4≤Hsd.

The large average value Have means the wide width in the X-axis direction of the flat surface 63 of the top shown in FIG. 4. The triangular facet of the second GaN layer 6 will present a trapezoid while being substantially triangular. Since crystal defects (dislocations) exist on the flat surface 63, and the overgrown layer 7 on the upper surface thereof does not grow in the lateral direction from the flat surface 63 but grows upward, the crystal defects are transmitted upward, and the relax ratio of the stress decreases with the increase in the area ratio of the flat surface 63.

Therefore, from this point of view, the small area ratio of the flat surface 63 to the entire area (the maximum value of the sectional area by the XY plane of the second GaN layer 6) of the horizontal plane of the second GaN layer 6 is desirable, and it is further preferable that the ratio is 20% or less in order that the dislocations in the overgrown layer 7 are sufficiently reduced and the generation of cracks is sufficiently prevented. And, since the ratio of the flat surface 63 to the entire area corresponds to the ratio of the average value Have to L/2, the preferable average value Have is L/10 or less.

Next, the lower limit is taken into consideration. The ratio of lattice mismatch between AlN and GaN is −2.4% for the A-axis direction, for example, of the crystal axis. Therefore, the ratios of lattice mismatch corresponding to the molar fractions are −0.48% and −0.72% for the AlGaN layer 7 with the AlN molar fraction of 20% and 30% laterally grown on the second GaN layer 6, respectively. In order to relax the stress in the area of width L/2 as shown in FIG. 12 and FIG. 13 in the lateral direction growth from the uneven surface, at least the average uneven width equivalent to the ratio of lattice mismatch is required. And, as described above, the standard deviation Hsd corresponds to a statistical width of a ridge or valley of the unevenness, and the width of the average uneven surface is given by doubling the Hsd. It is preferable that, as a substrate to respond to various types of devices, the relaxing effect on stresses is sufficiently achieved with respect to an overgrown layer with the AlN molar fraction of at least 20% or more. Accordingly, 2Hsd≥(L/2)·0.0048 is preferable. That is, it is preferable that Hsd is 0.0048 L/4 or more.

As described above, the above-described nitride semiconductor substrate is provided with a GaN semiconductor layer 6 and an overgrown layer 7 composed of AlGaN or InAlGaN, which is grown on the GaN semiconductor layer 6. The GaN semiconductor layer 6 has a plurality of protruding stripes, and both the sides 61 of the stripe are provided with an uneven surface 62, respectively.

Also, in XYZ-orthogonal coordinates, the thickness direction of the GaN semiconductor layer 6 is the Z-axis direction, and the stripes of the GaN semiconductor layer 6 extend along the Y-axis. The distance L between the centerlines C1 and C2 passing through the center points in the X-axis direction of the neighbor stripes and extending along the Y-axis, the average value Have and the standard deviation Hsd of the distances from the centerline C1 to uneven surfaces 62 in the XY plane, satisfy the relationship of the inequality expressions described above. In this case, it is possible to sufficiently prevent the generation of dislocations and cracks in the overgrown layer 7.

Hereinafter, a description is given of a method for producing a nitride semiconductor substrate 1 according to the present embodiment with reference to FIG. 15. The following steps (1) through (5) will be carried out one after another.

(1) First GaN Layer Growing Step

First, a sapphire substrate 2 is introduced and fixed in a chamber enabling crystal growth (MOCVD chamber) by a metal organic chemical vapor deposition (MOCVD) method, and a hydrogen atmosphere is created in the MOCVD chamber. And the surface of the sapphire substrate 2 is cleaned by a thermal process at 1050° C. for five minutes. Contaminated substances on the surface of the sapphire substrate 2 are removed by carrying out the thermal process under such appropriate conditions.

Next, the temperature of the sapphire substrate 2 is lowered to 475° C., and a group III gas including trimethyl gallium (TMG) and a nitrogen gas including ammonia ($NH_3$) are supplied, whereby a low-temperature GaN layer as a buffer layer 3 with the film thickness of 25 nm is grown on the sapphire substrate 2. And the substrate temperature is raised to 1075° C., and the group III gas including trimethyl gallium and a nitrogen gas including ammonia are supplied, whereby a GaN layer 4 with the film thickness of 2.5 µm thicker than that of the buffer layer 3, is grown.

(2) Mask Forming Step

The substrate processed in (1) is taken out from the MOCVD chamber and is introduced and fixed in a chamber (Plasma CVD chamber) enabling film-deposition by plasma CVD. And a $SiO_2$ film with the film thickness of 300 nm is deposited on the substrate. Next, the $SiO_2$ film is processed by a conventional photolithography technique and a conventional etching technique, thereby producing an insulative stripe pattern with a width of 3 μm in the X-axis direction and a period of 6 μm. Then, the $SiO_2$ stripe pattern is a mask 5. In addition, although the direction of the stripes is determined to be a GaN [1-100] crystal-axis direction, the stripes can be along another crystal-axis direction. Next, the substrate having the mask 5 formed by the $SiO_2$ stripe is again introduced and fixed in the MOCVD growth chamber, and then the ammonia atmosphere is created in the MOCVD chamber. The substrate is thermally processed at 1075° C. for five minutes.

(3) Second GaN Layer Forming Step

After that, triangular facet structures of the second GaN layer 6 are formed with the same gases as those used when forming the first GaN layer 4. GaN crystals are grown from the portions where the first GaN layer is exposed between the masks 5, and are bent and grown in the lateral direction (the left and right direction on paper) on the masks 5, wherein the GaN crystals are coalesced to each other at the middle part in the width direction of the masks 5. And, since the growth rate in the thickness direction (the upward direction on paper) at the middle part between the masks 5 is higher, the formed second GaN layer 6 exhibits a substantially triangular shape with a striped pattern having facets in the XZ section. Also, the substantially triangular facets also exhibit a trapezoidal shape with a flat portion at the top thereof as described above. In addition, since the crystal defects (dislocations) are bent toward the epitaxial direction of crystal, the crystal defects (dislocations) "a" mainly exist at the top and valleys of the triangular facets. At this time, the epitaxial pressure is set in the range from 76 to 760 Torr ($1 \times 10^5$ to $1 \times 10^6$ Pa), and the substrate temperature is set in the range from 850 to 1000° C. Then, by controlling respective gas flows, the triangular facet structures with uneven surface structures at the side can be formed.

Figure 16:
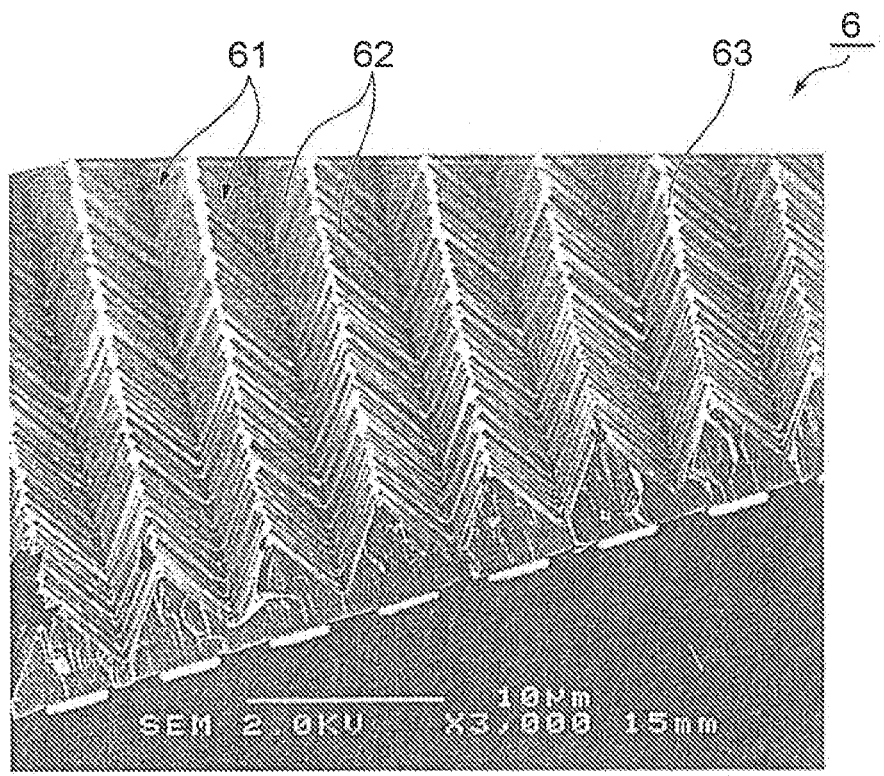
FIG. 16 is a view showing a photograph showing the second GaN semiconductor layer according to the embodiment.
Figure 17:
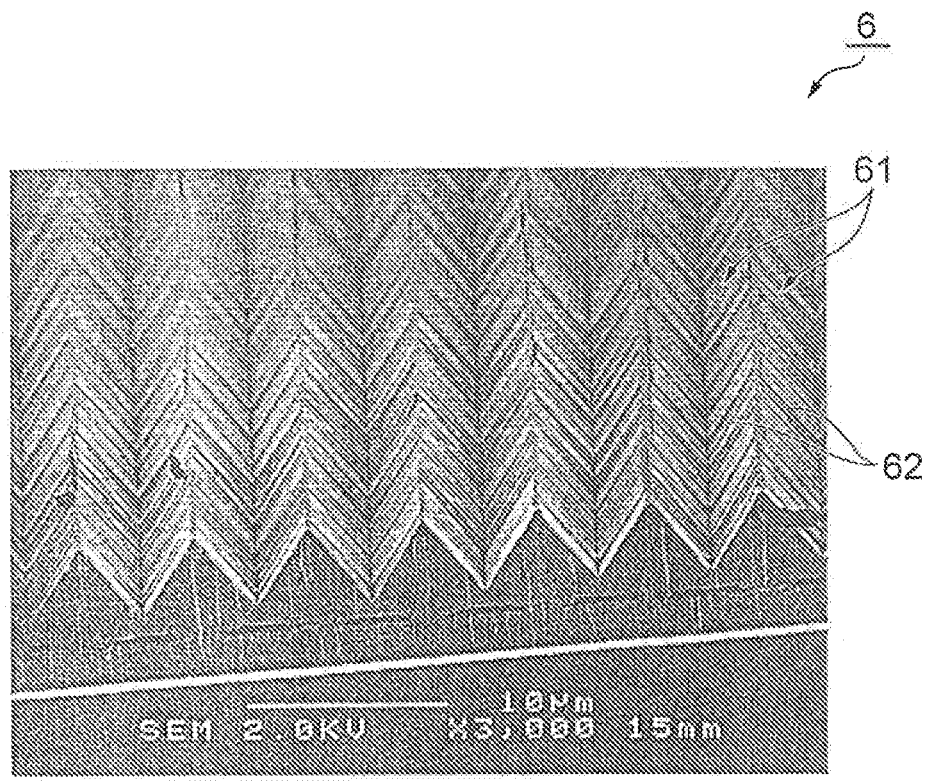
FIG. 17 is a view showing a photograph showing the second GaN semiconductor layer according to the embodiment.
Figure 18:
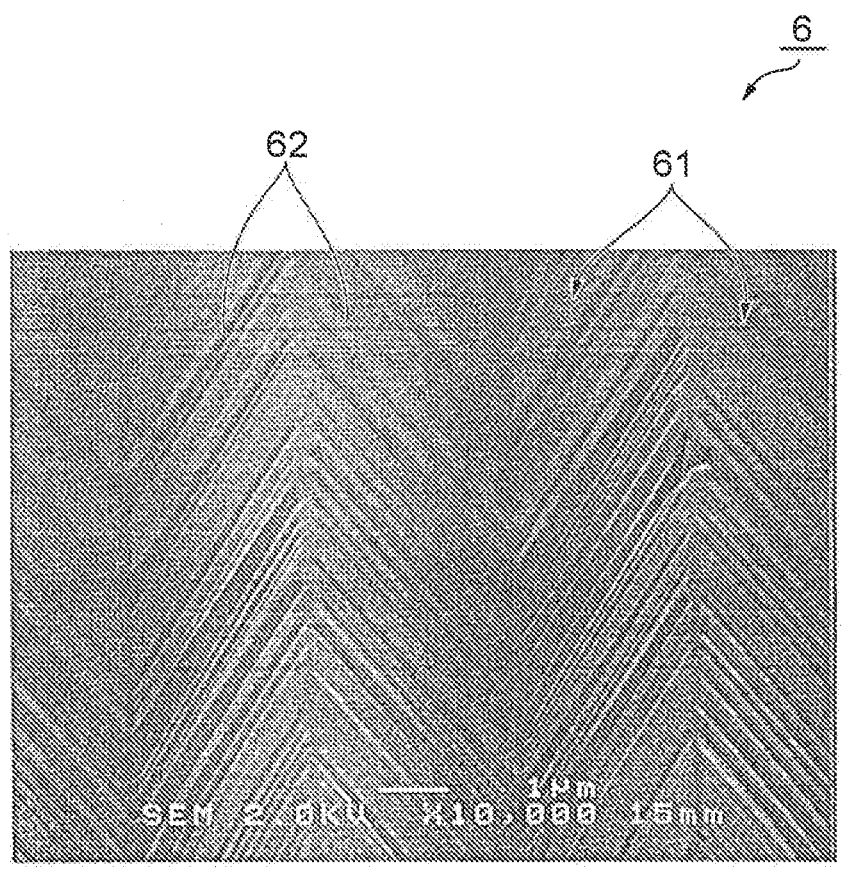
FIG. 18 is a view showing a photograph showing the second GaN semiconductor layer according to the embodiment.

FIG. 16, FIG. 17 and FIG. 18 show the photographs of the second GaN layer 6 actually formed based on the respective conditions described above. A stripe pattern of the second GaN layer 6 having substantially triangular facets is formed, and uneven surfaces 62 with small inclined surfaces are formed on the respective inclined surfaces 61 thereof. In FIG. 16, flat surfaces 63 at the tops can be observed. Here, although the uneven sizes in the preferable range described above are 7 nm≤Hsd and Have≤600 nm since the pitch of stripes is 6 μm, the average value Have of 100 nm or so, and the standard deviation Hsd of 8 to 33 nm can be estimated from the photographs.

(4) Overgrown Layer Forming Step

The temperature of the substrate processed in Step (3) is raised to 1125° C., thereby growing an $Al_{0.2}Ga_{0.8}N$ layer 7 ($Al_{X1}Ga_{Y1}N$ compound layer) with the film thickness of 8.4 μm. Thereby, the AlGaN layer 7 overgrow on a triangular facet structures of GaN layer 6, the surface of the substrate is flattened, and the nitride semiconductor substrate 1 is obtained. The value of the film thickness is an equivalent thickness grown on a flat substrate. Also, the pressure is determined to be 54 Torr ($7.2 \times 10^3$ Pa) for the growth.

Figure 15:
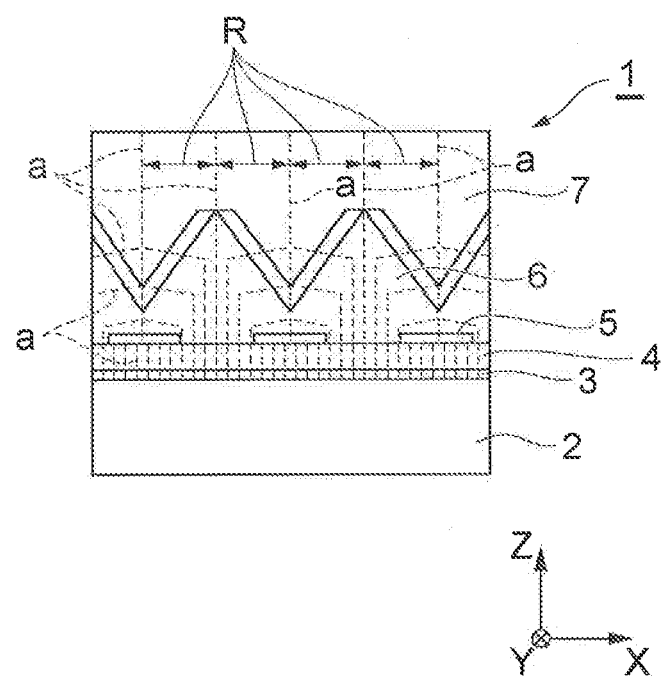
FIG. 15 is a longitudinally sectional view of a nitride semiconductor substrate according to the embodiment.

Although crystal defects (dislocations) exist at ridges and valleys of the triangular facets in the upper surface of the AlGaN layer 7 as shown in FIG. 15, the crystal growth with low dislocations is achieved at the other areas. Also, as described above, in the lateral direction epitaxial growth of AlGaN, the lateral direction growth vectors have not only components orthogonal to the direction along the stripes, but also components in the direction along the stripes, wherein the stresses that generate cracks are relaxed in all the directions, then the generation of cracks can be prevented.

(5) Semiconductor Structure Producing Step

The step of producing the nitride semiconductor substrate 1 is as described above, a description is given of an example of a process of producing a semiconductor structure on the substrate 1 processed above.

Figure 19:
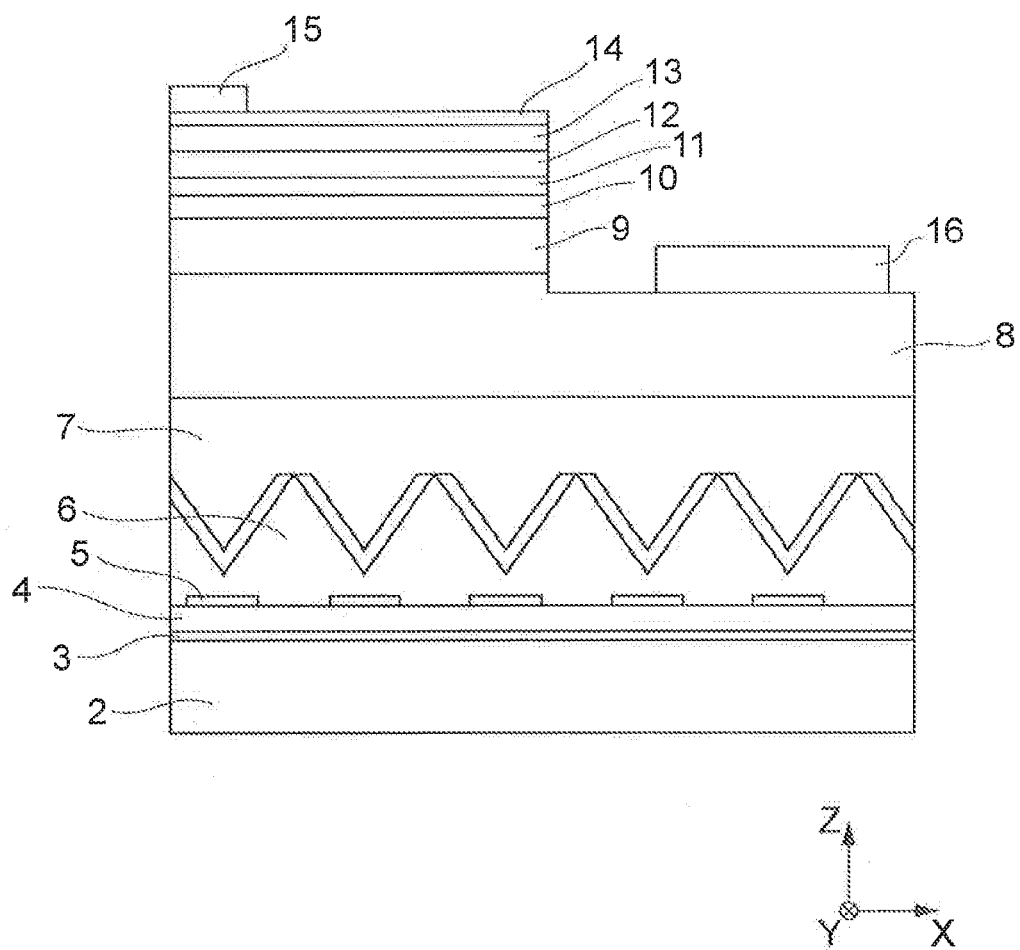
FIG. 19 is a longitudinally sectional view of a light-emitting device using the nitride semiconductor substrate.

FIG. 19 is a sectional view of a produced light-emitting device. On the substrate processed in Step (4), a 3-μm-thick Si-doped $Al_{0.2}Ga_{0.8}N$ layer (Si-doped contact layer) 8, a 250-nm-thick $Al_{0.2}Ga_{0.8}N$ layer (the first cladding layer) 9, an AlGaN quantum well structure (active layer) 10, a 20-nm-thick $Al_{0.35}Ga_{0.65}N$ layer (carrier block layer) 11, a 250-nm-thick Mg-doped $Al_{0.2}Ga_{0.8}N$ layer 12 (Mg-doped cladding layer) and a 50-nm-thick Mg doped GaN layer 13 (contact layer) are grown one after another in this order.

Further, a P-type transparent electrode 14 is formed on the contact layer 13, a P-type electrode 15 is formed on the transparent electrode 14, and an n-type electrode 16 is formed on the exposed surface of the contact layer 8, then finally the semiconductor structure is composed.

Although, in the present embodiment, the metal organic chemical vapor deposition method (MOCVD method) is used as the method for growing crystal, the present invention is not limited thereto. A molecular beam epitaxy (MBE) method, a hydride vapor phase epitaxy (HYPE) method, and other epitaxial methods can be used. Further, although, in the present embodiment, the gas including ammonia ($NH_3$) is used as the nitrogen gas, and the gas including a trimethyl gallium (TMG) and the trimethyl aluminum (TMA) is used as the group III gases, the present invention is not limited thereto. Also, although the gas including silane ($SiH_4$) is used as the n-type doping gas, and the gas including dicyclopentadienyl magnesium ($Cp_2Mg$) is used as the P-type doping gas, gases other than the above can be used.

Also, although, in the present embodiment, the GaN semiconductor layers 4 and 6 are composed of GaN and the AlGaN semiconductor layer as the overgrown layer 7 is composed of $Al_{X1}Ga_{Y1}N$, these can be composed of $In_{Z2}Al_{X2}Ga_{Y2}N$ and $In_{Z3}Al_{X3}Ga_{Y3}N$, respectively. X1, Y1, X2, Y2, Z2, X3, Y3 and Z3 express the composition ratios, respectively. Further, the substrate 2 is not limited to sapphire, and the buffer layer 3 is not limited to a low temperature GaN layer. Still further, the mask 5 is not limited to $SiO_2$. The choices of such materials are described in FIG. 20.

In addition, the combination and the number of times of use are not limited with respect to the components other than the substrate 2, the second GaN semiconductor layer 6 and the overgrown layer 7.

Figure 21:
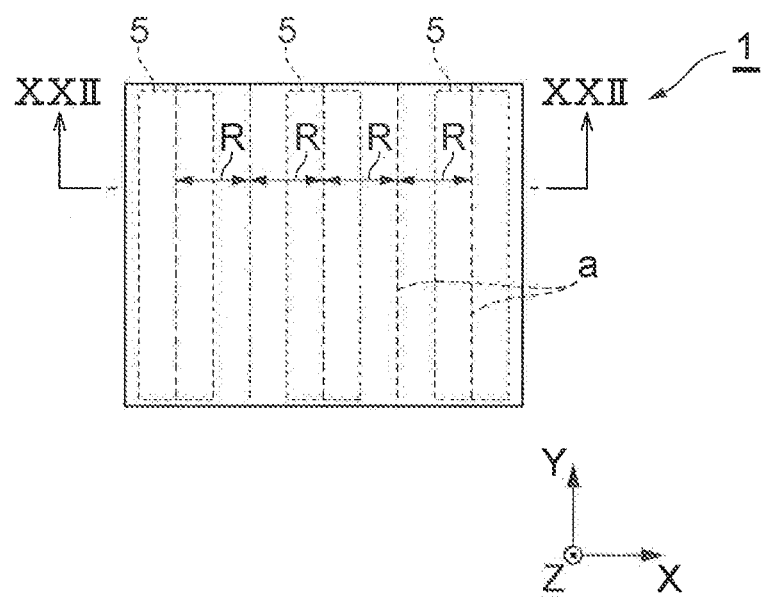
FIG. 21 is a plan view of a nitride semiconductor substrate according to another embodiment.
Figure 22:
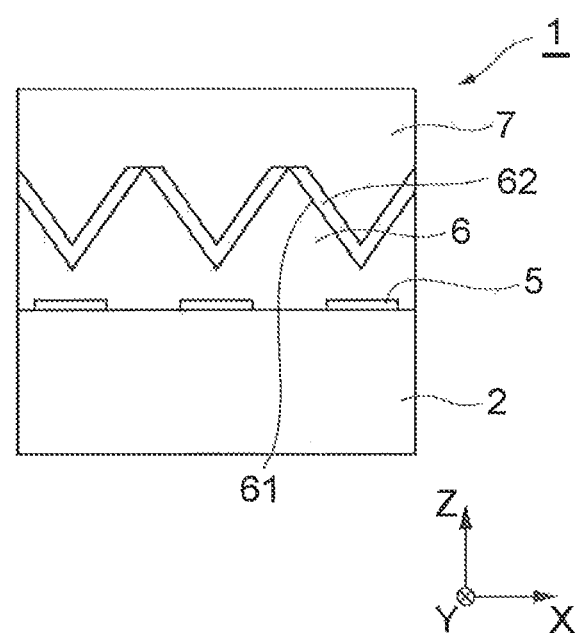
FIG. 22 is a longitudinally sectional view of the nitride semiconductor substrate shown in FIG. 21.

FIG. 21 is a plan view of such a nitride semiconductor substrate, FIG. 22 is a sectional view taken along the arrow XXII-XXII of the nitride semiconductor substrate shown in FIG. 21. For the nitride semiconductor substrate, the mask 5 of $SiO_2$ is formed directly on the substrate 2 composed of GaN without any buffer layer, the GaN layer 6 as the second GaN semiconductor layer with the cross-sectionally triangular facets is formed on the substrate 2, and then the AlGaN layer 7 is overgrown thereon. This is a case where, in FIG. 20, GaN is chosen as the substrate 2, [not inserted] is chosen as the buffer layer 3, $SiO_2$ is chosen as the mask 5, [not inserted]

is chosen as the first GaN semiconductor layer 4, GaN is chosen as the second GaN semiconductor layer 6, and AlGaN is chosen as the embedded layer 7. In this case, the base layer of the GaN layer 6 being the GaN semiconductor layer corresponds to the GaN substrate 2.

Also, in the present embodiment, although no buffer layer is formed between the first GaN layer 4 and the second GaN layer 6, a buffer layer can be provided therebetween. That is, a buffer layer with the film thickness of 25 nm is grown on the substrate, with the mask 5 formed at a substrate temperature of 475° C. in Step (2). After that, the triangular facet structures of GaN are formed. At this time, as in the above-described embodiment, the triangular facet structures with unevenness at the sides can be formed by controlling the conditions of the pressure, substrate temperature and respective gas flows.

Also, as an another example of the present embodiment, after a stripe masks 5 of $SiO_2$ are formed directly on the sapphire substrate 2, a low temperature GaN buffer layer is grown, a GaN layer 6 as the second GaN semiconductor layer with the cross-sectionally triangular facets is formed thereon, and an overgrown layer of AlGaN layer 7 can be formed. This is a case where, in FIG. 20, sapphire is chosen as the substrate 2, a [low temperature GaN buffer layer] is chosen as the buffer layer 3, $SiO_2$ is chosen as the mask 5, [not inserted] is chosen as the first GaN semiconductor layer 4, GaN is chosen as the second GaN semiconductor layer 6, and AlGaN is chosen as the overgrown layer 7. In this case, the base layer of the GaN layer 6 being the GaN semiconductor layer corresponds to the sapphire substrate 2 and a low temperature GaN buffer layer formed thereon.

In addition, in the present embodiment, an AlGaN layer or an InAlGaN layer 7 is grown directly on the upper surface of the second GaN semiconductor layer 6 with the cross-sectionally substantially triangulars, and no intermediate layer is inserted therebetween. Therefore, the production process can be simplified, a potential for additional crystal defects due to the intermediate layer can be suppressed. However, for example, due to the AlN molar fraction of 50% or more in the embedded layer 7, the difference in the lattice constants between the overgrown layer 7 and the second GaN semiconductor layer 6 is still larger, an intermediate layer to prevent cracks can be formed on the upper surface of the second GaN semiconductor layer 6 in addition to prevention of cracks by uneven surface of the triangular facets. Such an intermediate layer can be, for example, an AlN intermediate layer (General expression: $In_bAl_aGa_{1-a-b}N$) grown at 300 to 800° C. or an AlGaN strain prevention layer stacked on the AlN intermediate layer as well.

The major reference numerals in the above explanation are summarized below. That is, 1 indicates a nitride semiconductor substrate, 2 indicates a substrate, 3 indicates a buffer layer, 4 indicates a first GaN semiconductor layer, 5 indicates masks, 6 indicates a second GaN semiconductor layer, 61 indicates inclined surfaces, 62 indicates uneven surfaces (Small inclined surfaces), 63 indicates flat surfaces, 7 indicates an overgrown layer, "a" indicates dislocations, "b" indicates lateral direction growth vectors, Have indicates an average value of uneven sizes from the top in the pitch direction, Hsd indicates a standard deviation of uneven sizes from the top in the pitch direction, and L indicates a pitch of stripes of the second GaN semiconductor layer.

What is claimed is:

1. A nitride semiconductor substrate comprising:
a GaN semiconductor layer grown on a base layer, the GaN semiconductor layer having:
substantially triangular cross-sections along a thickness direction thereof, and
periodic stripe shapes each having uneven surfaces; and
an overgrown layer formed on the GaN semiconductor layer and comprised of AlGaN or InAlGaN,
wherein respective sides of stripes are comprised of a number of small inclined surfaces to form the eneven surfaces, each of the small inclined surfaces is roughly along a corresponding side of each of the stripes, and
wherein respective perpendicular directions of the small inclined surfaces of a corresponding side of the stripes in a horizontal section of the stripes vary in multiple directions.

2. A nitride semiconductor substrate, comprising:
a GaN semiconductor layer; and
an overgrown layer formed on the GaN semiconductor layer and comprised of AlGaN or InAlGaN,
wherein the GaN semiconductor layer includes a plurality of protruding stripes; and
both sides of the stripes have uneven surfaces, respectively,
wherein the respective sides of the stripes are comprised of a number of small inclined surfaces to form the uneven surfaces, each of the small inclined surfaces is roughly along a corresponding side of each of the stripes, and
wherein respective perpendicular directions of the small inclined surfaces of a corresponding side of the stripes in a horizontal section of the stripes vary in multiple directions.

* * * * *